United States Patent
Ho

(10) Patent No.: US 7,813,130 B2
(45) Date of Patent: Oct. 12, 2010

(54) ELECTRONIC DEVICE AND HEAT DISSIPATION UNIT THEREOF

(75) Inventor: Ming Yuan Ho, Taipei (TW)

(73) Assignee: ASUSTeK Computer Inc., Peitou, Taipei (TW)

( * ) Notice: Subject to any disclaimer, the term of this patent is extended or adjusted under 35 U.S.C. 154(b) by 0 days.

(21) Appl. No.: 12/393,947

(22) Filed: Feb. 26, 2009

(65) Prior Publication Data

US 2009/0279264 A1 Nov. 12, 2009

(30) Foreign Application Priority Data

May 6, 2008 (TW) .............................. 97116615 A

(51) Int. Cl.
*H05K 7/20* (2006.01)

(52) U.S. Cl. .................. 361/700; 361/699; 361/704; 361/707; 174/15.2; 165/104.26

(58) Field of Classification Search ........................ None
See application file for complete search history.

(56) References Cited

U.S. PATENT DOCUMENTS

| 7,079,394 B2 * | 7/2006 | Mok ........................... 361/700 |
| 7,212,404 B2 * | 5/2007 | Wang et al. .................. 361/697 |
| 7,274,572 B2 | 9/2007 | Wang et al. |
| 7,310,224 B2 | 12/2007 | Yang et al. |
| 7,474,526 B2 * | 1/2009 | Fujiwara ................. 361/679.52 |
| 7,551,442 B2 * | 6/2009 | Stefanoski .................. 361/700 |
| 7,561,417 B2 * | 7/2009 | Hung et al. ............ 361/679.52 |

\* cited by examiner

*Primary Examiner*—Boris L Chervinsky
(74) *Attorney, Agent, or Firm*—Winston Hsu; Scott Margo; Min-Lee Teng

(57) ABSTRACT

A heat dissipation unit is provided. The heat dissipation unit includes a heat sink, a first fixing station, a first heat pipe, a second fixing station and a second heat pipe. The first fixing station is located on a first plane. The first heat pipe is connected to the first fixing station and the heat sink. The second fixing station is located on a second plane, wherein a gap is formed between the first plane and the second plane. The second heat pipe is connected to the second fixing station and the heat sink, wherein the first fixing station partially overlaps the second fixing station.

13 Claims, 5 Drawing Sheets

_US 7,813,130 B2_

ELECTRONIC DEVICE AND HEAT DISSIPATION UNIT THEREOF

CROSS REFERENCE TO RELATED APPLICATIONS

This Application claims priority of Taiwan Patent Application No. 097116615, filed on May 6, 2008, the entirety of which is incorporated by reference herein.

BACKGROUND OF THE INVENTION

1. Field of the Invention

The present invention relates to a heat dissipation unit, and in particular relates to a heat dissipation unit utilized in a notebook.

2. Description of the Related Art

FIG. 1a shows a conventional heat dissipation unit 1 utilized in a notebook. The heat dissipation unit 1 comprises a heat sink 10, a fixing station 20, a fixing station 30, a heat pipe 21 and a heat pipe 31. A display card 22 is fixed on the fixing station 20. A display card 32 is fixed on the fixing station 30. The heat pipe 21 is connected to the fixing station 20 to move the heat generated by the display card 22 to the heat sink 10. Similarly, the heat pipe 31 is connected to the fixing station 30 to move the heat generated by the display card 32 to the heat sink 10. Conventionally, the display card 22 and the display card 32 are arranged side by side. Thus, the width of the notebook cannot be reduced. Additionally, because the display card 32 is far away from the heat sink 10, the length of the heat pipe 31 is long, heat resistance thereof is high, and heat dissipation efficiency is hindered.

FIG. 1b shows the conventional heat dissipation unit 1, the display card 22 and the display card 32 disposed on a circuit board 40. When the display card 22 and the display card 32 are connected to the circuit board 40 via connection port 23 and connection port 33, the connection port and the connection port 33 are connected to a controller 50 via wires 24 and wires 34. The wires 24 and wires 34 have a long length, which wastes energy and complicates circuit design.

BRIEF SUMMARY OF THE INVENTION

A detailed description is given in the following embodiments with reference to the accompanying drawings.

In one embodiment, a heat dissipation unit is provided. The heat dissipation unit comprises a heat sink, a first fixing station, a first heat pipe, a second fixing station and a second heat pipe. The first fixing station is located on a first plane. The first heat pipe is connected to the first fixing station and the heat sink. The second fixing station is located on a second plane, wherein a gap is formed between the first plane and the second plane. The second heat pipe is connected to the second fixing station and the heat sink, wherein the first fixing station partially overlaps the second fixing station.

In another embodiment, an electronic device is provided. The electronic device comprises a heat sink, a circuit board, a first fixing station, a first circuit element, a first heat pipe, a second fixing station, a second circuit element and a second heat pipe. The first fixing station is located on a first plane. The first circuit element is disposed on the first fixing station and electrically connected to the circuit board. The first heat pipe is connected to the first fixing station and the heat sink. The second fixing station is located on a second plane, wherein a gap is formed between the first plane and the second plane. The second circuit element is disposed on the second fixing station and electrically connected to the circuit board. The second heat pipe is connected to the second fixing station and the heat sink, wherein the first fixing station partially overlaps the second fixing station.

In the embodiment of the invention, the first circuit element overlaps the second circuit element, and the width of the notebook (electronic device) is thus reduced. Additionally, the distances between the circuit elements and the heat sink and the lengths of the first and second heat pipes are also reduced, thus, heat resistance thereof decreases and heat dissipation efficiency is improved.

BRIEF DESCRIPTION OF THE DRAWINGS

The present invention can be more fully understood by reading the subsequent detailed description and examples with references made to the accompanying drawings, wherein:

FIG. 2b is a sectional view in I-I direction of FIG. 2a;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
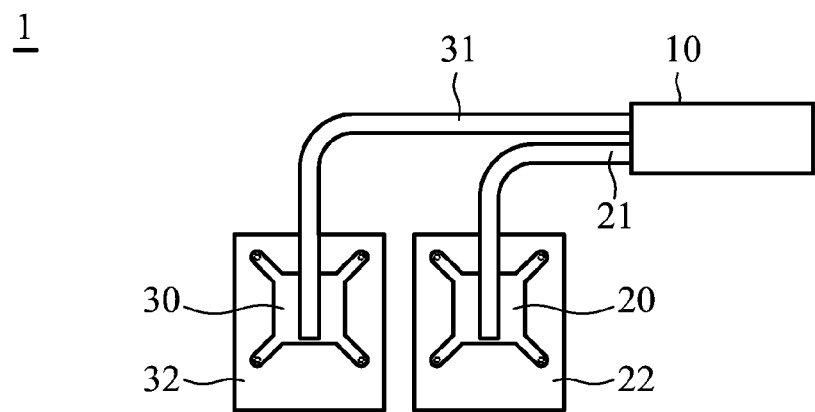
FIG. 1a shows a conventional heat dissipation unit.
Figure 1B:
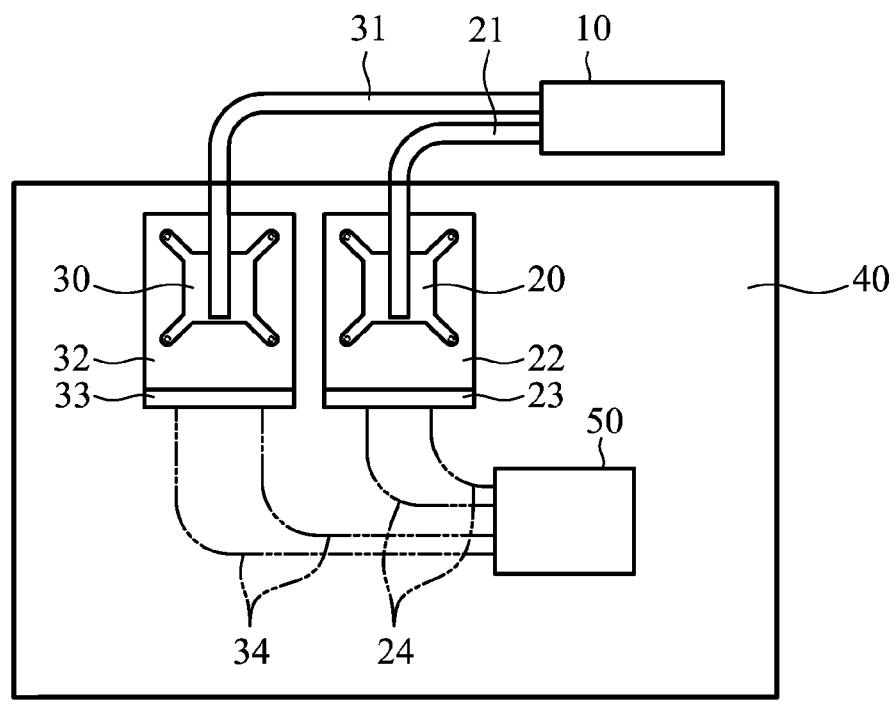
FIG. 1b shows the conventional heat dissipation unit and display cards disposed on a circuit board.
Figure 2A:
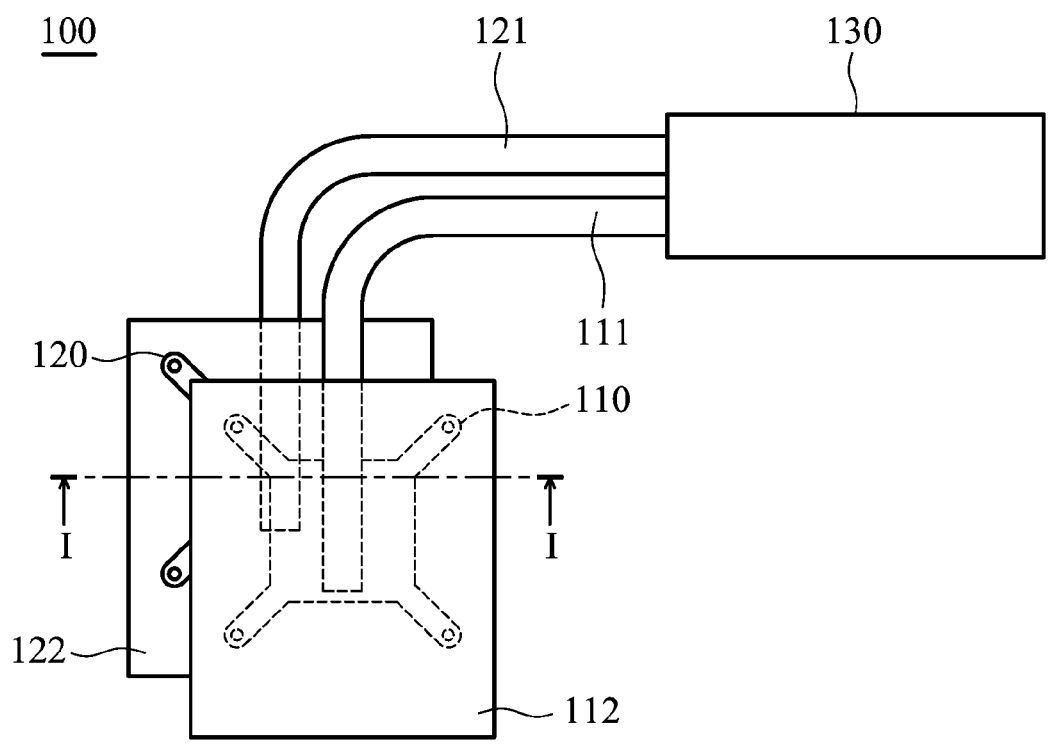
FIG. 2a shows a heat dissipation unit of an embodiment of the invention.

FIG. 2a shows a heat dissipation unit 100 of an embodiment of the invention, comprising a heat sink 130, a first fixing station 110, a first heat pipe 111, a second fixing station 120 and a second heat pipe 121. The first fixing station 110 is located on a first plane. The first heat pipe 111 is connected to the first fixing station 110 and the heat sink 130. The second fixing station 120 is located on a second plane. The second heat pipe 121 is connected to the second fixing station 120 and the heat sink 130. The first fixing station 110 is partially overlapping the second fixing station 120. The first fixing station 110 and the second fixing station 120 are elastic fixing sheets. The first heat pipe 110 and the second heat pipe 120 are substantially L shaped.

A first circuit element 112 is fixed on the first fixing station 110. A second circuit element 122 is fixed on the second fixing station 120. The first circuit element 112 and the second circuit element 122 are circuit cards, such as display cards.

Figure 2B:
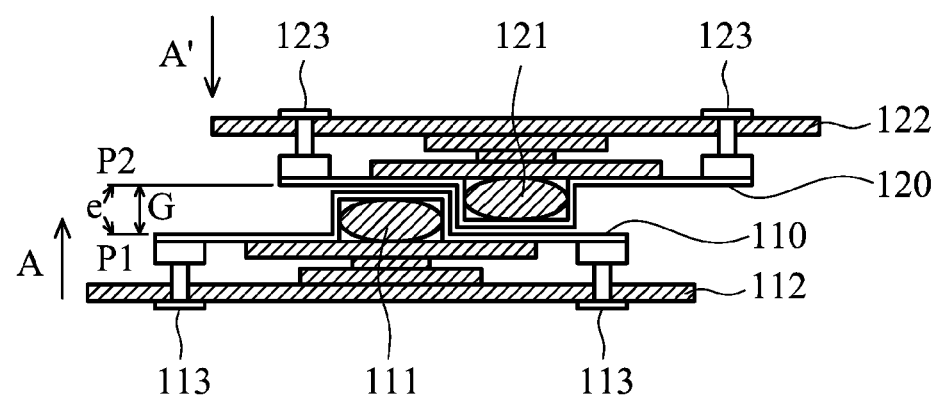

FIG. 2b is a sectional view in I-I direction of FIG. 2a, wherein a gap G is formed between the first plane P1 (the plane where the first fixing station 110 is) and the second plane P2 (the plane where the second fixing station 120 is). The first heat pipe 111 is partially held in the first fixing station 110. The second heat pipe 121 is partially held in the second fixing station 120.

With reference to FIG. 2b, the first circuit element 112 is fixed to the first fixing station 110 via first fixers (bolt) 113, and the second circuit element 122 is fixed to the second fixing station 120 via second fixers (bolt) 123. The first fixers 113 fix the first circuit element 112 along a first direction A, and the second fixers 123 fix the second circuit element 122 along a second direction A'. The first direction A is opposite to the second direction A'. The fixing directions mentioned above do not limit the invention.

In the embodiment of the invention, the first circuit element overlaps the second circuit element, and the width of the notebook (electronic device) is thus reduced. Additionally, the distances between the circuit elements and the heat sink and the lengths of the first and second heat pipes are also reduced, thus, heat resistance thereof decreases and heat dissipation efficiency is improved.

Figure 3:
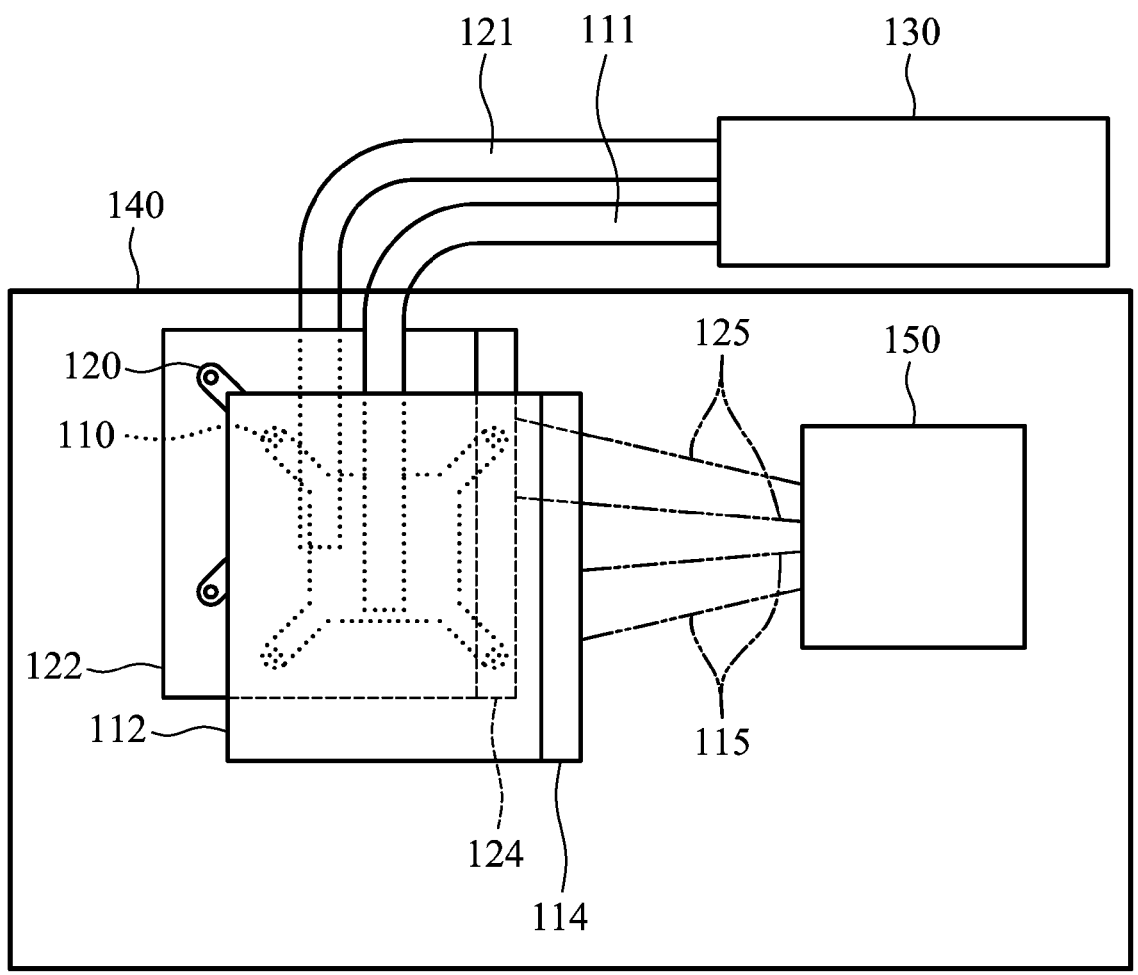
FIG. 3 shows the heat dissipation unit, the first circuit element and the second circuit element disposed on a circuit board.

FIG. 3 shows the heat dissipation unit 100, the first circuit element (display card) 112 and the second circuit element (display card) 122 disposed on a circuit board 140. When the first circuit element 112 is connected to the first connection port 114 and the second circuit element 122 is connected to the second connection port 124, the first connection port 114 is connected to a controller 150 via wires 115 and the second connection port 124 is connected to the controller 150 via wires 125. In the embodiment of the invention, the lengths of the wires 115 and the wires 125 is reduced, which decreases energy consumption and simplifies circuit design.

Figure 4:
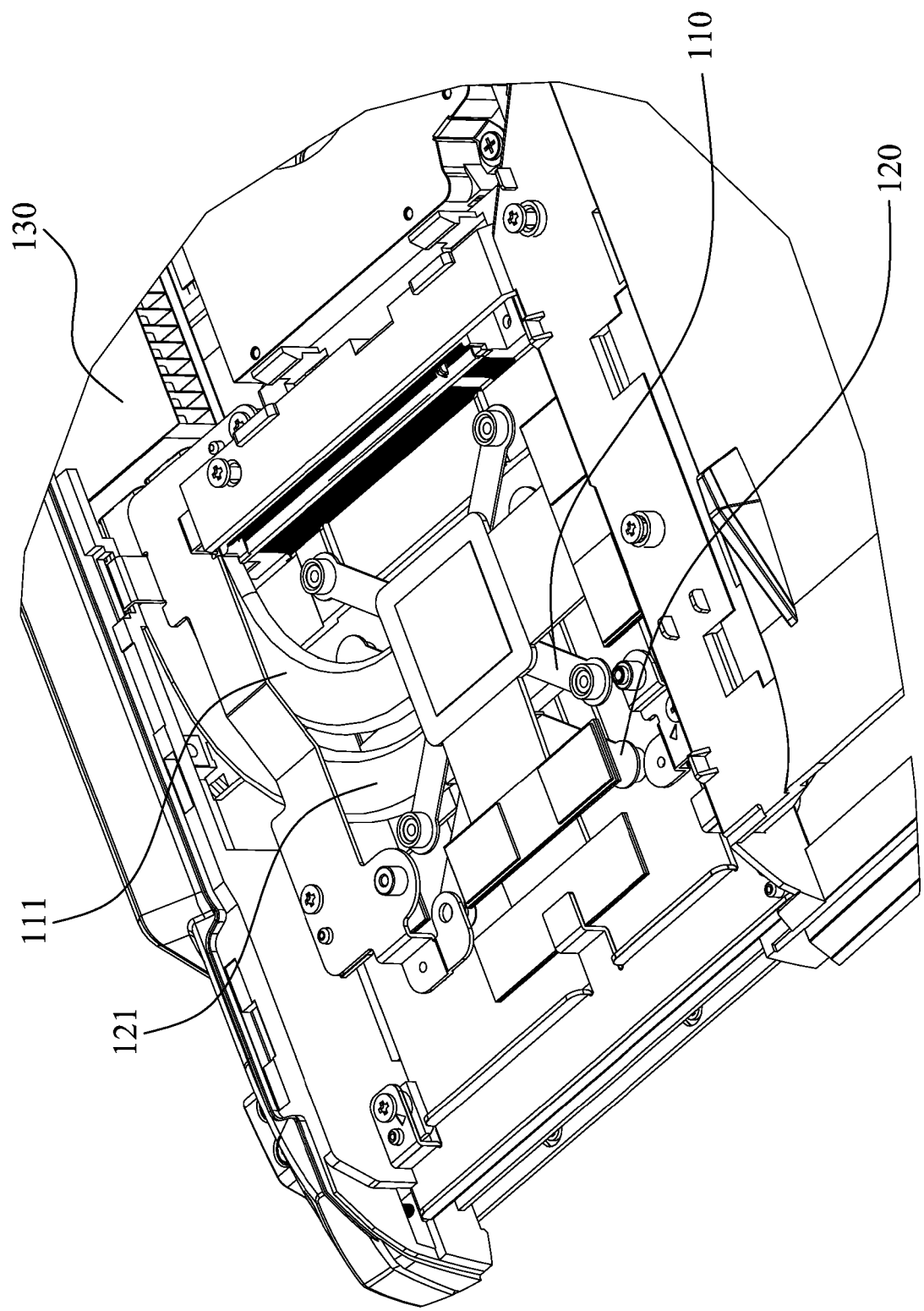
FIG. 4 is a perspective view of the assembled heat dissipation unit.

FIG. 4 is a perspective view of the assembled heat dissipation unit 100.

Figure 5:
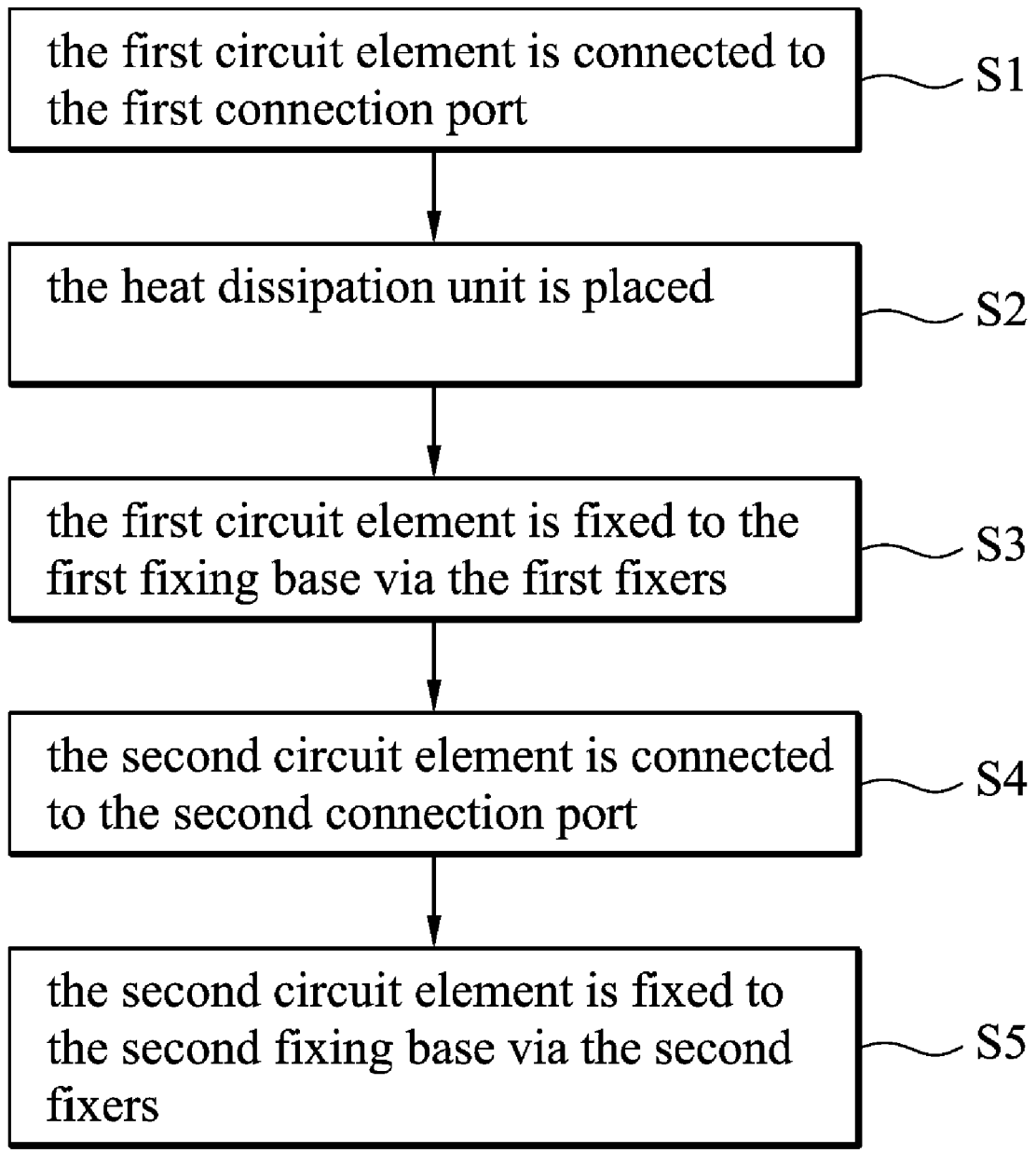
FIG. 5 shows a flowchart of assembly of the heat dissipation unit and the electronic device.

FIG. 5 shows a flowchart of assembly of the heat dissipation unit and the electronic device. First, the first circuit element is connected to the first connection port (S1). Then, the heat dissipation unit is attached (S2). Next, the first circuit element is fixed to the first fixing station via the first fixers (S3). Then, the second circuit element is connected to the second connection port (S4). Finally, the second circuit element is fixed to the second fixing station via the second fixers (S5).

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat dissipation unit, comprising:
   a heat sink;
   a first fixing station, located on a first plane, the first fixing station having a first accommodating portion;
   a first heat pipe, connected to the heat sink and accommodated in the first accommodating portion;
   a second fixing station, located on a second plane, the second fixing station having a second accommodating portion adjacent to the first accommodating portion; and
   a second heat pipe, connected to the heat sink and accommodated in the second accommodating portion, wherein the first fixing station partially overlaps the second fixing station.

2. The heat dissipation unit as claimed in claim 1, wherein the first fixing station and the second fixing station are elastic fixing sheets.

3. The heat dissipation unit as claimed in claim 1, wherein the first heat pipe and the second heat pipe are substantially L shaped.

4. An electronic device, comprising:
   a heat sink;
   a circuit board;
   a first fixing station, located on a first plane;
   a first circuit element, disposed on the first fixing station, and electrically connected to the circuit board;
   a first heat pipe, connected to the first fixing station and the heat sink;
   a second fixing station, located on a second plane;
   a second circuit element, disposed on the second fixing station and electrically connected to the circuit board; and
   a second heat pipe, connected to the second fixing station and the heat sink, wherein the first fixing station partially overlaps the second fixing station.

5. The electronic device as claimed in claim 4, wherein the first heat pipe is partially held in the first fixing station.

6. The electronic device as claimed in claim 5, wherein the second heat pipe is partially held in the second fixing station.

7. The electronic device as claimed in claim 4, wherein the first fixing station and the second fixing station are elastic fixing sheets.

8. The electronic device as claimed in claim 4, wherein the first heat pipe and the second heat pipe are substantially L shaped.

9. The electronic device as claimed in claim 4, further comprising a first fixer, wherein the first fixer fixes the first circuit element to the first fixing station along a first direction.

10. The electronic device as claimed in claim 9, further comprising a second fixer, wherein the second fixer fixes the second circuit element to the second fixing station along a second direction, and the second direction is opposite to the first direction.

11. The electronic device as claimed in claim 4, wherein the first circuit element and the second circuit element are circuit cards.

12. The electronic device as claimed in claim 11, wherein the first circuit element and the second circuit element are display cards.

13. The electronic device as claimed in claim 4, wherein the first fixing station has a first accommodating portion, the second fixing station has a second accommodating portion adjacent to the first accommodating portion, the first heat pipe is accommodated in the first accommodating portion, and the second heat pipe is accommodated in the second accommodating portion.

* * * * *